(12) United States Patent
Tsai et al.

(10) Patent No.: US 6,740,540 B2
(45) Date of Patent: May 25, 2004

(54) FABRICATION METHOD FOR CIRCUIT BOARD (75) Inventors: Chung-Che Tsai, Hsinchu (TW); Jin-Chuan Bai, Hsinchu (TW)

(73) Assignee: Ultra Tera Corporation (TW)

( * ) Notice: Subject to any disclaimer, the term of this patent is extended or adjusted under 35 U.S.C. 154(b) by 170 days.

(21) Appl. No.: 10/170,664

(22) Filed: Jun. 12, 2002

(65) Prior Publication Data

US 2003/0173331 A1 Sep. 18, 2003

(51) Int. Cl.[7] .................................................. H01L 21/44
(52) U.S. Cl. ........................ 438/106; 438/108; 438/118; 438/612; 174/255
(58) Field of Search ................................. 438/106, 108, 438/111, 118, 119, 612; 174/255, 256, 257

(56) References Cited

U.S. PATENT DOCUMENTS

| | | | |
|---|---|---|---|
| 6,217,987 B1 | * 4/2001 | Ono et al. | ................... 428/209 |
| 6,455,355 B1 | * 9/2002 | Lin et al. | .................... 438/119 |
| 6,609,297 B1 | * 8/2003 | Hiramatsu et al. | ............. 29/852 |
| 2002/0053465 A1 | * 5/2002 | Kawakita et al. | ........... 174/256 |
| 2002/0145203 A1 | * 10/2002 | Adae-Amoakoh et al. | .. 257/778 |
| 2003/0132025 A1 | * 7/2003 | Wakihara et al. | ........... 174/256 |

* cited by examiner

Primary Examiner—Tuan H. Nguyen
(74) Attorney, Agent, or Firm—Peter F. Corless; Steven M. Jensen; Edwards & Angell, LLP (57) ABSTRACT A fabrication method for a circuit board is proposed, wherein a core layer is formed with a plurality of conductive traces, and photo resist is applied on terminals of the conductive traces. A non-solderable material is peelably applied over a support member, and attached to the core layer to cover the conductive traces, wherein adhesion between the support member and the non-solderable material is smaller than adhesion between the non-solderable material and the core layer. Then, the support member is peeled to expose the non-solderable material; further, the non-solderable material is partly removed to expose the photo resist. Finally, the photo resist is etched away to expose the terminals of the conductive traces. The exposed terminals serve as bond pads or fingers where solder balls, bumps or wires are bonded for electrical connection purpose.

22 Claims, 8 Drawing Sheets

FABRICATION METHOD FOR CIRCUIT BOARD

FIELD OF THE INVENTION

The present invention relates to fabrication methods for circuit boards, and more particularly, to a method for fabricating a substrate or a printed circuit board (PCB).

BACKGROUND OF THE INVENTION

In conventional processes for fabricating a circuit board such as substrate or printed circuit board (PCB), first, a core layer is prepared by fiber glass, epoxy resin, polyimide, FR4 resin or BT resin, etc. Then, at least a copper film is attached to the core layer, and patterned to form a plurality of conductive traces on the core layer. Since the trace-forming process is well known in the art, it is not to be further described herein.

After that, solder mask is applied over the conductive traces to form protective coating on the core layer, so as to protect the conductive traces against oxidation or short circuit without affecting electricity thereof. In more detail, solder mask is first applied over the core layer by halftone-printing, roller-coating, screen-coating or electrostatic-spraying processes. Then, undesired part of solder mask is removed through the use of exposure and development techniques; remaining solder mask is baked under high temperature and become cured to form the protective coating.

However, the above conventional circuit board is inherent with significant drawbacks. For example, during the process for applying solder mask over the core layer, halftone-printing or roller-coating processes are performed in multiple times for accumulating solder mask with desired thickness; this considerably increases process complexity in fabrication. And, accumulated thickness of solder mask is hardly controlled, which may adversely affect planarity and electrical stability of the circuit board. Moreover, in the baking process under high temperature, due to mismatch in coefficient of thermal expansion (CTE) between solder mask and the core layer of the circuit board, thermal stress would be generated and causes warpage of the circuit board. Furthermore, during coating solder mask over the core layer, air would be possibly trapped in solder mask to form voids, which facilitates the occurrence of popcorn effect in subsequent fabrication processes. In addition, solder mask is poorly adhered with copper traces formed on the core layer; this would easily cause delamination at interface between solder mask and conductive traces, and undesirably affect quality and reliability of the circuit board.

Figure 5A:
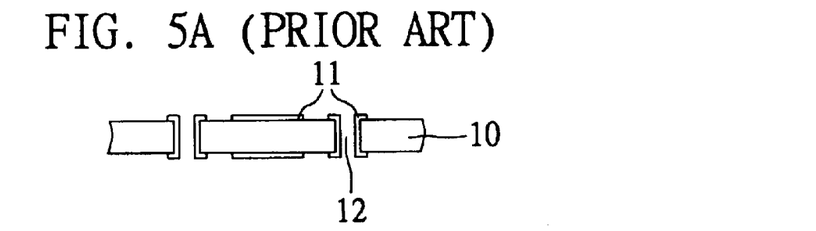
FIGS. 5A–5E (PRIOR ART) are cross-sectional schematic diagrams showing the steps involved in a conventional fabrication method for a circuit board.

Therefore, there is disclosed another method for fabricating a circuit board. This fabrication method for a circuit board 1 can be carried out by process steps illustrated in FIGS. 5A to 5E. Referring to FIG. 5A, the first step is to prepare a core layer 10, with predetermined patterning of copper conductive traces 11 being formed on two opposing surfaces of the core layer 10. A plurality of vias 12 are formed to penetrate through the core layer 10, and plated with copper on inner walls thereof The core layer 10 can be made of a material same as that used for a conventional circuit board, such as epoxy resin, polyimide resin, FR4 resin, etc.

Figure 5B:
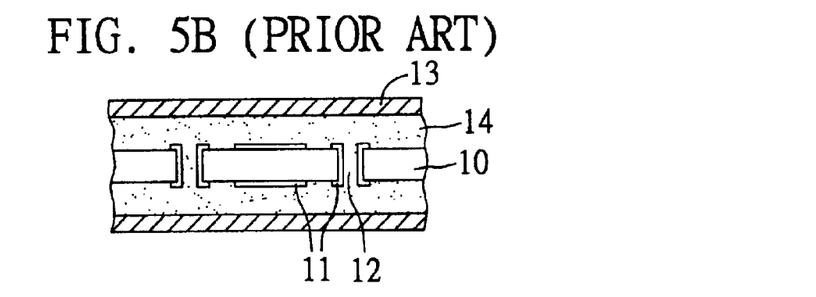

Referring to FIG. 5B, the next step is to apply a non-solderable material 14 in predetermined thickness over an aluminum film 13. The non-solderable material 14 is preferably made of a material having coefficient of thermal expansion (CTE) similar to or same as that of the core layer 10.

Then, the non-solderable material 14 together with the aluminum film 13 are attached to the core layer 10 for covering the conductive traces 11, in a manner that the non-solderable material 14 is interposed between the aluminum film 13 and the core layer 10. Under predetermined pressure (10–40 kgw/cm$^2$) and temperature (185° C.), the non-solderable material 14 becomes cured and fully fills the vias 12 and other fine holes of the core layer 10, and thus the non-solderable material 14 forms a desired protective layer for protecting the conductive traces 11 against oxidation and external impact.

Figure 5C:
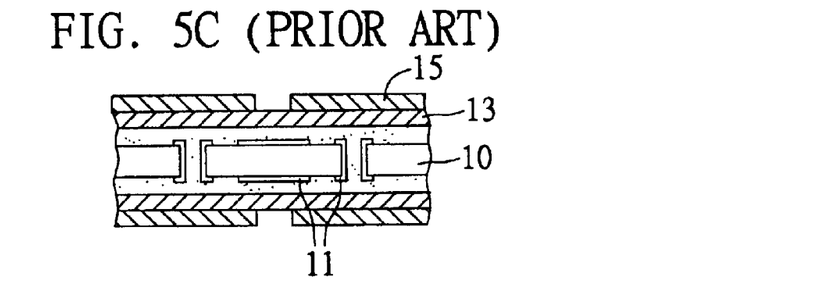

Referring to FIG. 5C, a layer of photo resist 15 is applied over an exposed surface of the aluminum film 12. The photo resist 15 is selectively removed by using exposure and development processes, so as to expose predetermined part of the aluminum film 13, wherein the exposed part of the aluminum film 13 corresponds to predetermined positions of the underneath conductive traces 11 to be later exposed for use as bond pads or fingers where solder balls, bumps or wires are bonded for electrical connection purpose.

Figure 5D:
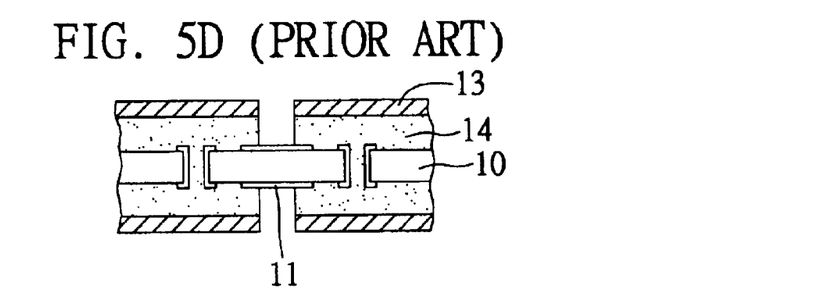

Referring to FIG. 5D, remaining photo resist 15 and exposed part of the aluminum film 13 are etched away by using chemical solvents, so as to expose predetermined part of the non-solderable material 14 covering bond pad or finger positions of the underneath conductive traces 11. Then, the exposed part of the non-solderable material 14 is removed by plasma etching technique, such that bond pads or fingers of the conductive traces 11 can be desirably exposed.

Figure 5E:
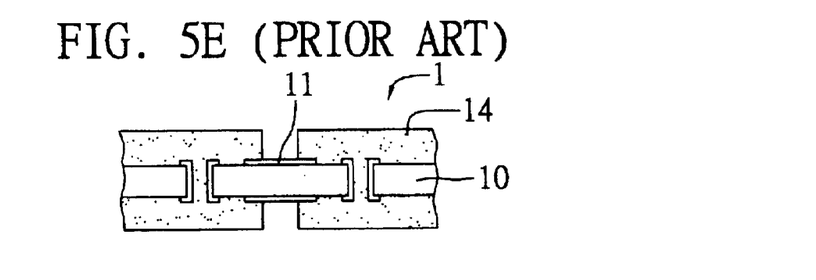

Finally referring to FIG. 5E, remaining aluminum film 13 is chemically etched to completely expose the non-solderable material 14.

The above-fabricated circuit board 1 can desirably eliminate those outlined drawbacks for the foregoing conventional circuit board. For example, one single step of applying non-solderable material 14 allows to desirably achieve predetermined thickness for the non-solderable material 14, thereby effectively reducing complexity and costs in fabrication. Moreover, since the non-solderable material 14 has coefficient of thermal expansion similar to or same as that of the core layer 10, the circuit board II can be assured with structural intactness without being warped by thermal stress, thus making production yield greatly improved. In addition, the non-solderable material 14 is firmly attached to the core layer 10 and conductive traces 11 under condition of certain temperature and pressure, and thus air is hardly trapped in the non-solderable material 14, so that popcorn effect or delamination would significantly reduce in occurrence, making quality and reliability of the circuit board 1 firmly assured.

However, the above fabrication method for the circuit board 1 still has considerable drawbacks. First, conductive traces 11 formed on the core layer 10 are covered by multi-layered structure including the non-solderable material 14, aluminum film 13 and photo resist 15; as such, it is difficult to visually recognized predetermined part of the conductive traces 11 to be exposed through such multi-layer structure. In order to precisely position corresponding part of the photo resist 15 aligned with the part of the conductive traces 11 to be exposed, X-ray fluoroscopy is usually adopted to determine fiducial marks on the photo resist 15. However, X-ray fluoroscopy still possibly causes positioning inaccuracy up to ±75 $\mu$m, making etched part of the aluminum film 13 and non-solderable material 14 not precisely positioned in correspondence with the predetermined exposed part of the conductive traces 11, which deteriorates production yield of fabrication circuit boards 1.

Moreover, during fabrication processes, with the photo resist 15, aluminum film 13 and non-solderable material 14 being stacked on the core layer 10, for exposing predetermined part of the conductive traces 1, it needs to in turn remove the photo resist 15, aluminum film 13 and non-solderable material 14, thereby making process complexity and costs in fabrication undesirably increased.

Furthermore, the non-solderable material 14 is partly removed by plasma-etching technique; for suitably applying the plasma-etching process, the non-solderable material e.g. epoxy resin 14 cannot be added with fillers, which makes the non-solderable material 14 relatively low in structural strength, thereby not able to provide the circuit board 1 with high rigidity or mechanical strength.

In addition, the plasma-etching technique is used to selectively remove the non-solderable material 14 and form a plurality of openings where predetermines positions of the conductive traces 11 can be exposed, wherein the exposed positions of the conductive traces 11 serve as bond pads or fingers for subsequently accommodating solder balls, bumps or wires for electrical connection purpose. These openings formed by the plasma-etching technique are SMD (solder mask define) openings; as shown in FIG. 5E, each SMD opening is dimensioned smaller in surface area than the underneath conductive trace 11; that is, part of the underneath conductive trace 11 is unexposed and covered under the non-solderable material 14. As such, adjacent openings are at least spaced apart from each other by the distance of unexposed part of adjacent conductive traces 11; this would hardly reduce the distance between adjacent openings and pitch spacing between neighboring bond pads or fingers, making the circuit board 1 not suitably used for mounting with fine-pitch or high-density arrangement of solder balls, bumps or wires.

During the process for attaching the non-solderable material 14 to the core layer 10, it is hard to precisely control the planarity of the non-solderable material 14 relative to that of the core layer 10. With unsatisfactory planarity of the non-solderable material 14, for example, certain part of the non-solderable material 14 would be relatively small in thickness, during the plasma-etching process, relatively thinner portion of the non-solderable material 14 would be completely etched away in accompany with part of or entire the underneath conductive traces 11 (only 15 μm thick); this undesirably damages electrical connection quality and production yield of fabricated circuit boards 1.

Figure 6:
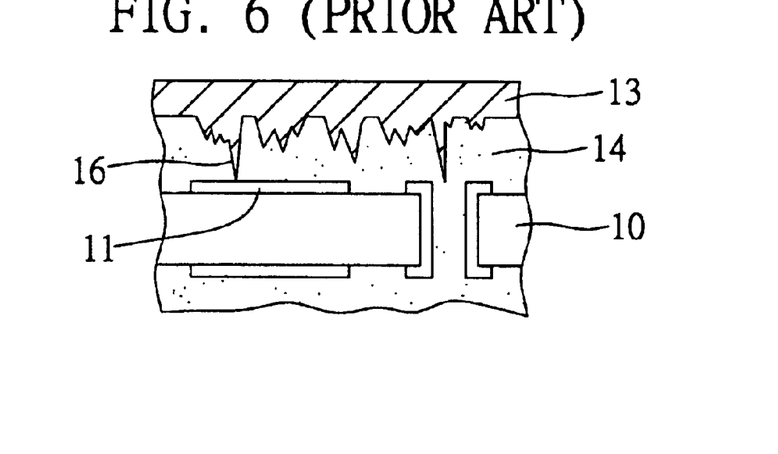
FIG. 6 (PRIOR ART) is a cross-sectional schematic diagram showing the occurrence of short circuit for a conventional circuit board.

As shown in FIG. 6, if the aluminum film 13 is surface-roughed or low in surface smoothness with forming of protrusions 16, these protrusions 16 extend through the non-solderable material 14 and are hard to be removed completely by etching technique. If the protrusions 16 even extend to reach the conductive traces 11, it may cause short-circuiting problems. For improving the planarity of the aluminum 13, it would nevertheless increase fabrication costs.

Figure 7A:
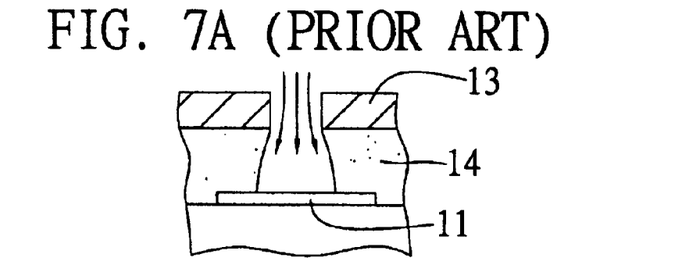
FIGS. 7A and 7B (PRIOR ART) are cross-sectional schematic diagrams respectively showing side-etching effect and impaired electrical connection of solder balls for the conventional circuit board.
Figure 7B:
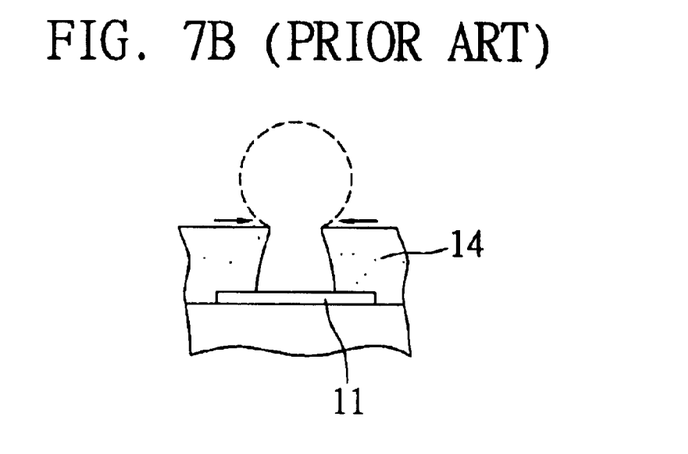

As shown in FIG. 7A, another drawback for the above circuit board 1 is side-etching effect. During the plasma-etching process for partly removing the non-solderable material 14, plasma-produced radicals are non-directional and may also etch side walls of openings formed through the aluminum 13 and non-solderable material 14, i.e. side-etching effect. This side-etching effect would become more severe downwardly toward the non-solderable material 14, and generate more adverse influence on positioning or dimensioning of the openings for exposing bond pad or finger positions of the conductive traces 11. As shown in FIG. 7B, when solder balls (as indicated by dotted lines in the drawing) are implanted at these side-etched openings, since solder balls and the non-solderable material 14 are different in coefficient of thermal expansion, thermal stress produced by the non-solderable material 14 would attack solder balls (as indicated by arrows in the drawing), and impair electrical connection between solder balls and the circuit board 1 that is thereby of quality and reliability concern.

Therefore, how to develop a novel fabrication method for a circuit board to eliminate the above drawbacks, is a critical problem to solve.

SUMMARY OF THE INVENTION

A primary objective of the present invention is to provide a fabrication method for a circuit board, so as to precisely expose predetermined positions (bond pads or bond fingers) of conductive traces formed on the circuit board, thereby greatly improving yield of fabricated circuit boards.

Another objective of the invention is to provide a fabrication method for a circuit board, wherein a support member, instead of an aluminum film conventionally used in the art, can be repetitively used to sustain a non-solderable material thereon, and easily peeled from the non-solderable material, making fabrication time and production costs effectively reduced.

A further objective of the invention is to provide a fabrication method for a circuit board, wherein conventional plasma etching technique is not adopted for fabricating the circuit board, so that drawbacks of side-etching effect and impaired electrical connection through the use of plasma etching technique can be eliminated, thereby assuring quality and reliability of fabricated circuit boards.

A further objective of the invention is to provide a fabrication method for a circuit board, which allows the circuit board to be optionally made with relatively soft or rigid structure, thereby providing more flexibility in modulating mechanical strength of fabricated circuit boards.

In accordance with the above and other objectives, the present invention proposes a fabrication method for a circuit board, comprising the steps of: preparing a core layer that is formed with predetermined circuitry of conductive traces on at least a surface thereof, each of the conductive traces being formed with a terminal, and applying photo resist on the terminal of each of the conductive traces; peelably applying a non-solderable material in predetermined thickness over a support member, and attaching the non-solderable material to the surface of the core layer where the conductive traces are formed, wherein adhesion between the support member and the non-solderable material is smaller than adhesion between the non-solderable material and the core layer; heating and pressurizing the non-solderable material, allowing the non-solderable material to be firmly attached to the core layer; peeling the support member from the non-solderable material to expose the non-solderable material; partly removing the non-solderable material to expose the photo resist applied on the core layer; and removing the photo resist from the core layer to expose the terminals of the conductive traces.

The above-fabricated circuit board is suitably used as a substrate for accommodating integrated circuits, or a printed circuit board (PCB); and the circuit board can provide significant benefits. First, terminals (bond pads or fingers) of conductive traces formed on a core layer of the circuit board are in advance covered by photo resist, and then directly exposed by removing the photo resist. This assures terminal positions of the conductive traces to be precisely exposed, and therefore, eliminates the drawback of positioning inaccuracy at circuit or trace exposure in the prior art.

Moreover, non-solderable material is peelably applied over a support member and attached to the core layer in this invention, since adhesion between the support member and non-solderable material is considerably small, thus the support member can be easily peeled away from the non-solderable material, without damaging the attachment of the non-solderable material to the core layer; and the support member can be repetitively used, thereby effectively reducing fabrication costs. Further, without using an aluminum film for sustaining non-solderable material in the prior art, short-circuiting problems caused by surface roughness of the aluminum film should not be concerned in this invention.

Instead of plasma etching technique, grinding/laser-etching and chemical-etching processes are adopted to form openings for exposing predetermined terminals of conductive traces in the invention, and thus, drawbacks generated by using the plasma etching technique can be avoided. For example, the non-solderable material can be optionally added with fillers, and allow the circuit board of this invention to be structured with flexible mechanical strength. Moreover, without using the plasma etching technique, conductive traces of this circuit board would not be plasma-etched as in the case of the prior art; thereby, electrical connection quality and production yield of the circuit board can be assured in this invention.

In another embodiment, non-solderable material is directly applied over a jig instead of an additional support member, thereby further reducing fabrication complexity and costs.

In a further embodiment, openings formed through non-solderable material allow terminals of conductive traces to be completely exposed to the openings; these openings are NSMD (non-solder mask define) openings. Unlike adjacent SMD openings being spaced apart by at least the distance of unexposed part of neighboring conductive traces in the prior art, spacing between adjacent NSMD openings can be further reduced by decreasing the intermediate non-solderable material; this allows pitch distance for bond pads or fingers to be desirably reduced, making the circuit board of this invention suitable used for accommodating high-density arrangement of solder balls, bumps or wires.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

The following description is made with reference to FIGS. 1–4 for detailing the preferred embodiments of a fabrication method for a circuit board proposed in the present invention. The drawings illustratively show components or parts only relating to the disclosure of this invention; it should be understood that, these components or parts are not drawn in real sizes or numbers, and the circuit board of this invention is structurally more complex in practical fabrication.

First Preferred Embodiment

Figure 1A:
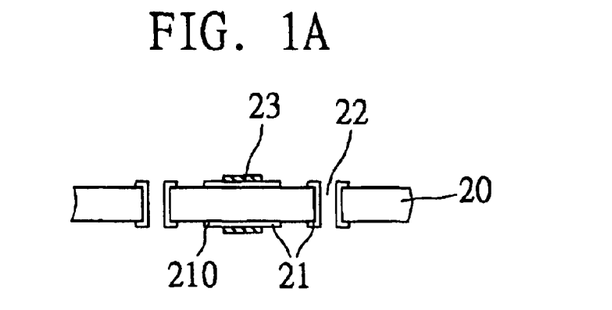
FIGS. 1A–1F are cross-sectional schematic diagrams showing the steps involved in a fabrication method for a circuit board of a first preferred embodiment of the invention.

The fabrication method for a circuit board 2 of the invention, as illustrated in FIGS. 1A to 1F, comprises the following steps. Referring to FIG. 1A, the first step is to prepare a core layer 20, and a plurality of conductive traces 21 are formed on two opposing surfaces of the core layer 20. The conductive traces 21 are defined with a plurality of terminals 210 that serve as bond pads or bond fingers to be bonded with solder balls, solder bumps or bonding wires (not shown) for electrical connection purpose. And, an insulating material 23 such as photo resist is applied on each of the terminals 210 of the conductive traces 21.

The core layer 20 is made of a resin material, such as epoxy resin, polyimide, BT resin, FR4 resin, etc. The conductive traces 21 are formed by attaching at least a copper film to the core layer 20, and patterning the copper film to define the conductive traces 21. A plurality of vias 22 are adapted to penetrate through the core layer 20, and plated with copper on inner walls thereof, for electrically interconnecting the conductive traces 21 formed on opposing surfaces of the core layer 20. Since fabrication processes of the core layer 20 and conductive traces 21 are conventional in the art, they are not to be further detailed herein.

Figure 1B:
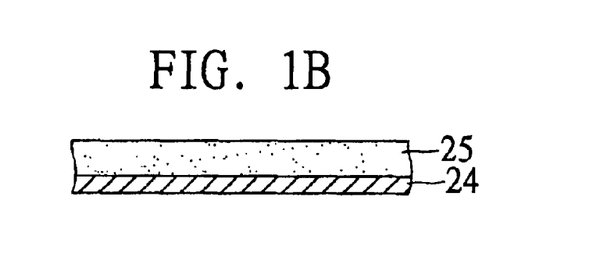
Figure 1C:
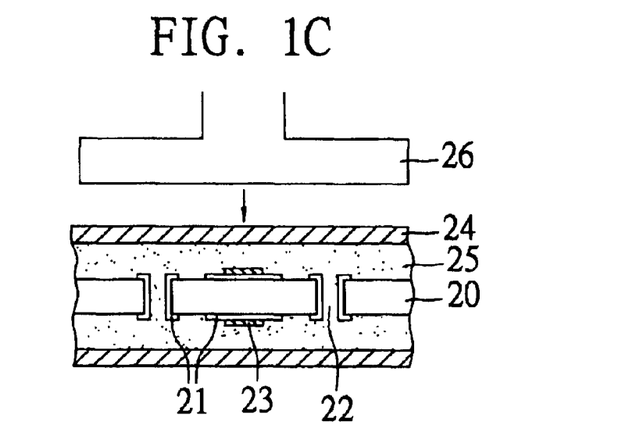

Referring to FIGS. 1B and 1C, the next step is to peelably apply a semi-cured non-solderable material 25 in predetermined thickness over a support member 24. The semi-cured non-solderable material 25 together with the support member 24 are attached to the core layer 20 for covering the conductive traces 21, in a manner that the non-solderable material 25 is interposed between the support member 24 and the core layer 20, wherein adhesion between the support member 24 and the non-solderable material 25 is smaller than adhesion between the non-solderable material 25 and the core layer 20.

A jig 26 is used to press on the support member 24; by applying certain temperature and pressure, the semi-cured non-solderable material 25 becomes cured and strongly attached to the core layer 20. This allows the non-solderable material 25 to fill into the vias 22 and other fine holes of the core layer 20, and form a protective layer for protecting the conductive traces 21.

The non-solderable material 25 is dimensioned in thickness to completely cover the conductive traces 21 and the insulating material 23 formed on the core layer 20. And, the non-solderable material 25 can be made of epoxy resin, polyimide resin, BT resin, FR4 resin, FR5 resin, or combination thereof. Preferably, the non-solderable material 25 has coefficient of thermal expansion (CTE) similar to or same as that of the core layer 20.

Figure 1D:
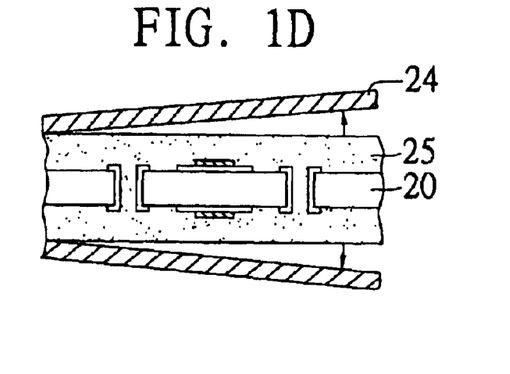

Referring to FIG. 1D, the support member 24 is peeled away from the non-solderable material 25 in a direction indicated by arrows in the drawing, so as to expose the non-solderable material 25. As adhesion between the support member 24 and the non-solderable material 25 is smaller than adhesion between the non-solderable material 25 and the core layer 20, thereby the support member 24 can be easily removed from the non-solderable material 25, without adversely affecting the firm attachment of the non-solderable material 25 to the core layer 20.

Figure 1E:
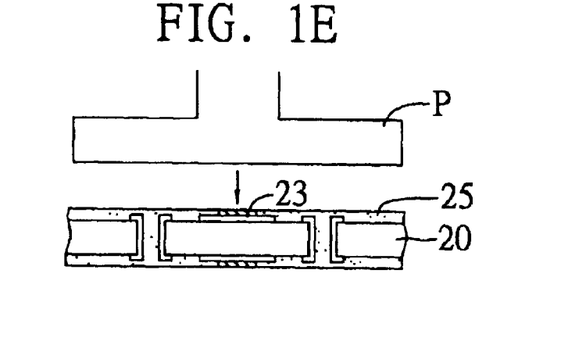

Referring to FIG. 1E, the non-solderable material 25 is partly removed to expose the insulating material 23 formed on the core layer 20. Grinding of using a grinder P or laser-etching technique can be adopted to remove part of the non-solderable material 25; it should be understood that, other techniques applicable for removal of the non-solderable material 25, are also pertained to the scope of the invention.

Figure 1F:
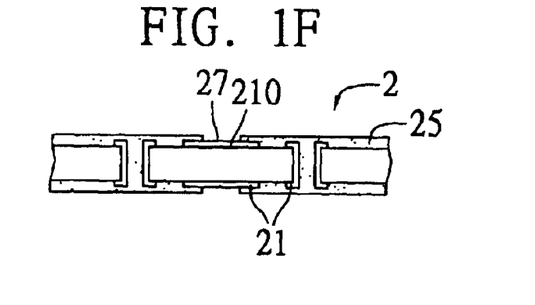

Finally referring to FIG. 1F, the exposed insulating material 23 is etched away by using conventional chemical solvents; this forms a plurality of openings 27 through the non-solderable material 25, whereby the terminals 210 of the conductive traces 21 covered with the insulating material 23 can be exposed to the openings 27. The exposed terminals 210 then serve as bond pads or bond fingers to be later bonded with solder balls, solder bumps or bonding wires for electrical connection purpose, or are plated thereon with other metal for protecting copper against oxidation.

The above-fabricated circuit board 2 is suitably used as a substrate for accommodating integrated circuits, or a printed circuit board (PCB); and the circuit board 2 can provide significant benefits. First, terminals (bond pads or fingers) 210 of conductive traces 21 formed on a core layer 20 of the circuit board 2 are in advance covered by an insulting material (photo resist) 23, and then directly exposed by removing the insulting material 23. This assures predetermined terminals 210 of the conductive traces 21 to be precisely exposed, and therefore, eliminates the drawback of positioning inaccuracy at circuit or trace exposure in the prior art.

Moreover, non-solderable material 25 is peelably applied over a support member 24 and attached to the core layer 20 in this invention, since adhesion between the support member 24 and non-solderable material 25 is considerably small, thus the support member 24 can be easily peeled away from the non-solderable material 25, without damaging the attachment of the non-solderable material 25 to the core layer 20; and the support member 24 can be repetitively used, thereby effectively reducing fabrication costs. Further, without using an aluminum film for sustaining non-solderable material in the prior art, short-circuiting problems caused by surface roughness of the aluminum film should not be concerned in this invention.

Instead of plasma etching technique, grinding/laser-etching and chemical-etching processes are adopted to form openings 27 for exposing terminals 210 of the conductive traces 21 in the invention, and thus, drawbacks generated by the plasma etching technique can be avoided. For example, the non-solderable material 25 can be optionally added with fillers, and allow the circuit board 2 of this invention to be structured with flexible mechanical strength. Moreover, without using the plasma etching technique, conductive traces 21 of this circuit board 2 would not be plasma-etched as those possibly occurred in the prior art; thereby, electrical connection quality and production yield of the circuit board 2 are assured in this invention.

Figure 2:
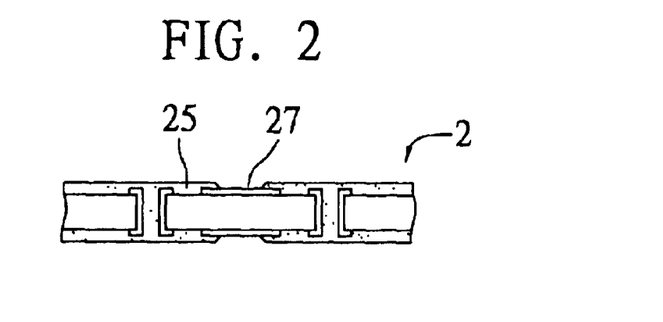
FIG. 2 is a cross-sectional view of an embodiment of the circuit board of the inventions.

In addition, further without utilizing the plasma etching process, this invention is free of concern with problems of side-etching effect and impaired electrical connection. As shown in FIG. 2 of the circuit board 2 of the invention, an opening 27 formed through the non-solderable material 25 can be shaped with an enlarged mouth as inverted trapezoid; when a solder ball is implanted at this mouth-enlarged opening 27, it would solve the problem of impairment to electrical connection caused by thermal stress from non-solderable material 25, so as to assure quality and reliability of the circuit board 2.

Second Preferred Embodiment

FIGS. 3A to 3E illustrate the second embodiment of the fabrication method for a circuit board 2 of the invention. This embodiment is similar to the previous first embodiment; thus, components or parts in this embodiment are designated by the same reference numerals as those in the first embodiment.

Figure 3A:
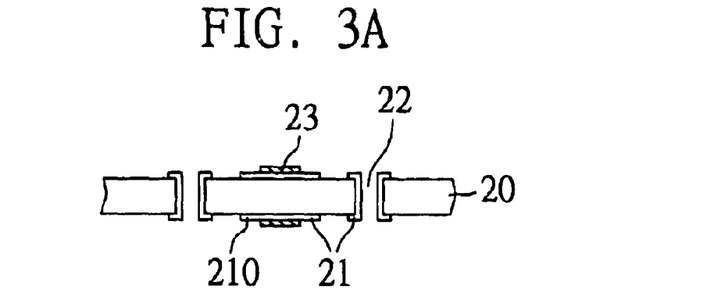
FIGS. 3A–3E are cross-sectional schematic diagrams showing the steps involved in a fabrication method for a circuit board of a second preferred embodiment of the invention.

Referring first to FIG. 3A, a core layer 20 formed with conductive traces 21 is prepared, and an insulating material e.g. photo resist 23 is applied on terminals 210 of the conductive traces 21. As fabrication processes for the core layer 20, conductive traces 21 and insulating material 23 are the same as those in the first embodiment, no further description thereto is here to be repeated.

Figure 3B:
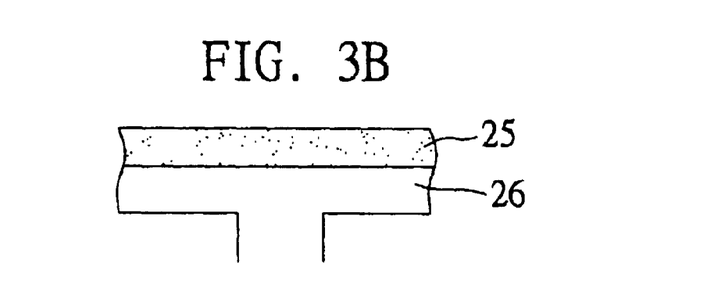

Referring to FIG. 3B, a jig 26 is provided, and a semi-cured non-solderable material 25 is applied in predetermined thickness over the jig 26.

Figure 3C:
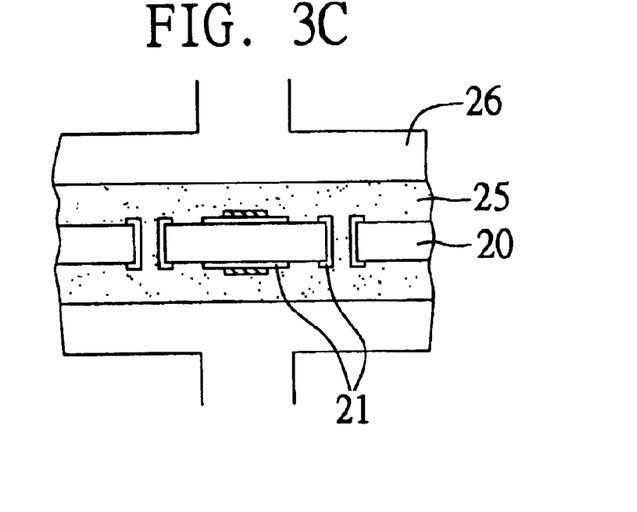

Referring to FIG. 3C, the semi-cured non-solderable material 25 applied over the jig 26 is attached to the core layer 20 for covering the conductive traces 21, in a manner that the non-solderable material 25 is interposed between the jig 26 and the core layer 20, wherein adhesion between the jig 26 and the non-solderable material 25 is smaller than adhesion between the non-solderable material 25 and the core layer 20. The non-solderable material 25 is subject to certain temperature and pressure, and becomes cured to be strongly attached to the core layer 20 and the conductive traces 21.

Figure 3D:
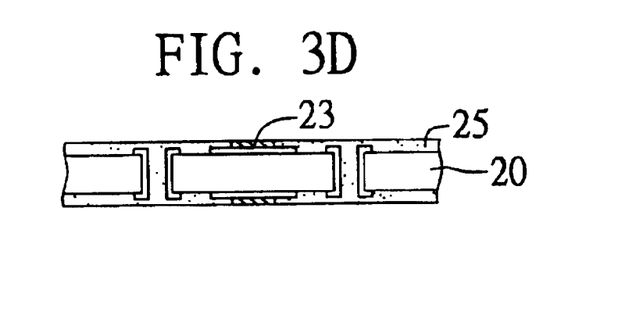

Referring to FIG. 3D, the jig 26 is removed from the non-solderable material 25, allowing the non-solderable material 25 to be exposed. As adhesion between the jig 26 and the non-solderable material 25 is smaller than adhesion between the non-solderable material 25 and the core layer 20, thereby the jig 26 can be easily removed away from the non-solderable material 25, without adversely affecting the firm attachment of the non-solderable material 25 to the core layer 20. Then, the exposed non-solderable material 25 is partly removed to expose the insulating material 23 formed on the core layer 20.

Figure 3E:
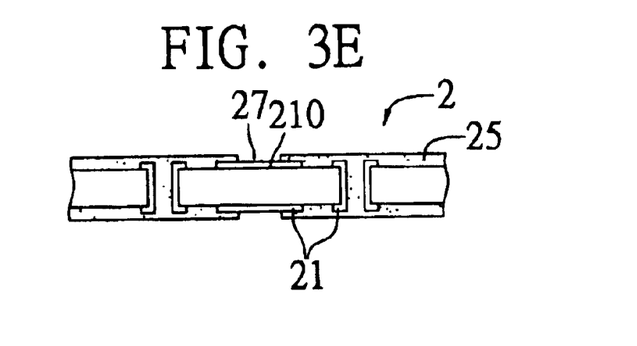

Finally referring to FIG. 3E, the exposed insulating material 23 is etched away by using conventional chemical solvents, whereby a plurality of openings 27 are formed through the non-solderable material 25, allowing the terminals 210 of the conductive traces 21 covered with the insulating material 23 to be exposed to the openings 27.

Besides multiple benefits provided in the foregoing first embodiment, as non-solderable material 25 is directly applied over a jig 26 instead of an additional support member used in the first embodiment, the second embodiment can be further advantageous in reduction of fabrication complexity and costs.

Third Preferred Embodiment

FIGS. 4A to 4E illustrate the third embodiment of the fabrication method for a circuit board 2 of the invention. This embodiment is similar to the previous first embodiment; thus, components or parts in this embodiment are designated by the same reference numerals as those in the first embodiment.

Figure 4A:
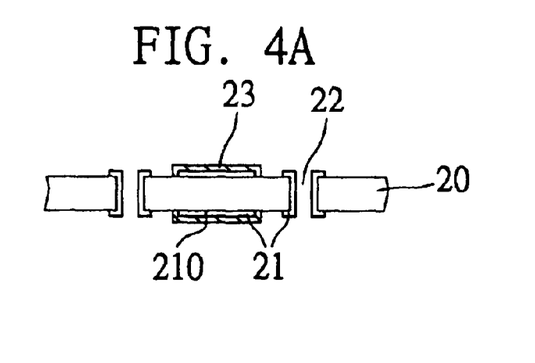
FIGS. 4A–4E are cross-sectional schematic diagrams showing the steps involved in a fabrication method for a circuit board of a third preferred embodiment of the invention.

Referring first to FIG. 4A, a core layer 20 formed with conductive traces 21 is prepared, and an insulating material 23 is applied on a terminal 210 of each conductive trace 21 in a manner as to entirely cover the terminal 210.

Figure 4B:
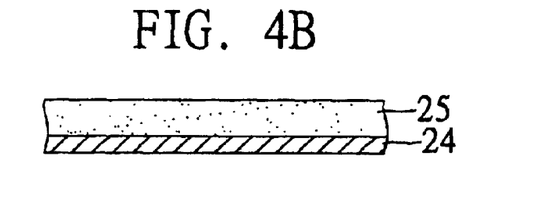
Figure 4C:
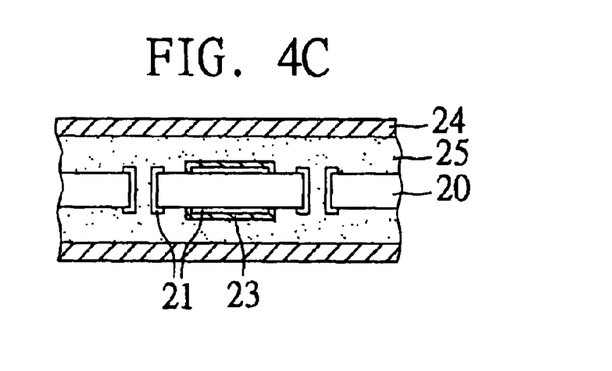

Referring to FIGS. 4B and 4C, a non-solderable material 25 is applied in predetermined thickness over a support member 24, and then attached to the core layer 20 for covering the conductive traces 21, in a manner that the non-solderable material 25 is interposed between the support member 24 and the core layer 20, wherein adhesion between the support member 24 and the non-solderable material 25 is smaller than adhesion between the non-solderable material 25 and the core layer 20.

Then, a jig (not shown) is used to press on the support member 24, allowing the non-solderable material 25 to undergo certain temperature and pressure, and become cured to be strongly attached to the core layer 20 and the conductive traces 21.

Figure 4D:
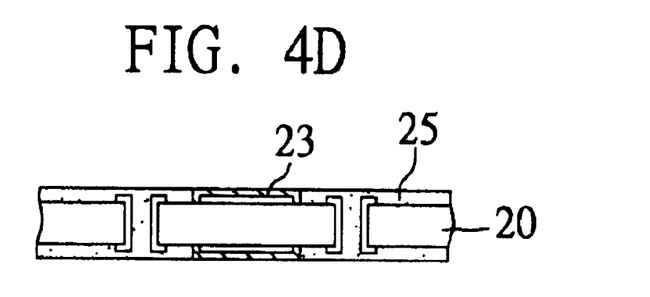

Referring to FIG. 4D, the support member 24 is peeled from the non-solderable material 25, allowing the non-solderable material 25 to be exposed. Then, the non-solderable material 25 is partly removed to expose the insulating material 23 formed on the core layer 20.

Figure 4E:
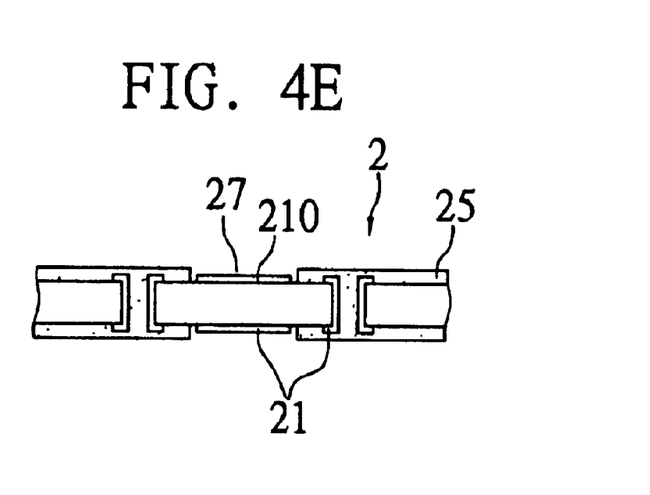

Finally referring to FIG. 4E, the exposed insulating material 23 is etched away by using conventional chemical solvents, whereby a plurality of openings 27 are formed through the non-solderable material 25, allowing the terminals 210 of the conductive traces 21 covered with the insulating material 23 to be exposed to the openings 27. As the terminals 210 of the conductive traces 21 are beforehand entirely covered by the insulating material 23, thus when the insulating material 23 is removed, the terminals acting as bond pads or bond fingers can be completely exposed to the openings 27 formed through the non-solderable material 25.

The characteristic feature of this embodiment is the forming of openings 27 by which terminals 210 of conductive traces 21 are completely exposed for use as bond pads or fingers; these openings 27 are NSMD (non-solder mask define) openings. Unlike adjacent SMD openings being spaced apart by at least the distance of unexposed part of neighboring conductive traces in the prior art, spacing between adjacent NSMD openings can be further reduced by decreasing the intermediate non-solderable material; this allows pitch distance for bond pads or fingers to be desirably reduced, making the circuit board of this invention suitably used for accommodating high-density arrangement of solder balls, bumps or wires.

Moreover, the fabrication method for the circuit board of the above second embodiment, is also suitably used in this embodiment, in which non-solderable material is directly applied over a jig and then attached to a core layer of the circuit board. Therefore, besides multiple benefits provided in the above first embodiment, this embodiment is further advantageous in reduction of pitch spacing between adjacent bond pads or fingers as well as fabrication complexity and costs.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method for a circuit board, comprising the steps of:
    preparing a core layer that is formed with a plurality of conductive traces on at least a surface thereof, each of the conductive traces being formed with a terminal; and applying an insulating material on the terminal of each of the conductive traces;
    peelably applying a non-solderable material in predetermined thickness over a support member, and attaching the non-solderable material to the surface of the core layer where the conductive traces are formed, wherein adhesion between the support member and the non-solderable material is smaller than adhesion between the non-solderable material and the core layer;
    heating and pressurizing the non-solderable material, allowing the non-solderable material to be firmly attached to the core layer;
    peeling the support member from the non-solderable material to expose the non-solderable material;
    partly removing the non-solderable material to expose the insulating material applied on the core layer; and
    removing the insulating material from the core layer to expose the terminals of the conductive traces.

2. The fabrication method of claim 1, wherein the insulating material is photo resist.

3. The fabrication method of claim 2, wherein the photo resist is removed by etching technique of using chemical solvents.

4. The fabrication method of claim 1, wherein the insulating material partly covers the terminal.

5. The fabrication method of claim 1, wherein the insulating material entirely covers the terminal.

6. The fabrication method of claim 1, wherein the non-solderable material is dimensioned in thickness to completely cover the conductive traces and the insulating material formed on the core layer.

7. The fabrication method of claim 1, wherein the non-solderable material has coefficient of thermal expansion similar to that of the core layer.

8. The fabrication method of claim 1, wherein the non-solderable material has coefficient of thermal expansion same as that of the core layer.

9. The fabrication method of claim 1, wherein semi-cured non-solderable material is spread over the support member; in the heating and pressurizing step, predetermined temperature and pressure are applied to the semi-cured non-solderable material, so as to cure and firmly attach the non-solderable material to the core layer.

10. The fabrication method of claim 1, wherein the non-solderable material is partly removed by using a grinder.

11. The fabrication method of claim 1, wherein the non-solderable material is partly removed by laser-etching technique.

12. A fabrication method for a circuit board, comprising the steps of:
    preparing a core layer that is formed with a plurality of conductive traces on at least a surface thereof, each of the conductive traces being formed with a terminal; and applying an insulating material on the terminal of each of the conductive traces;
    applying a non-solderable material in predetermined thickness over a jig, and attaching the non-solderable material to the surface of the core layer where the conductive traces are formed, wherein adhesion between the jig and the non-solderable material is smaller than adhesion between the non-solderable material and the core layer;

heating and pressurizing the non-solderable material, allowing the non-solderable material to be firmly attached to the core layer;

removing the jig from the non-solderable material to expose the non-solderable material;

partly removing the non-solderable material to expose the insulating material applied on the core layer; and removing the insulating material from the core layer to expose the terminals of the conductive traces.

13. The fabrication method of claim 12, wherein the insulating material is photo resist.

14. The fabrication method of claim 13, wherein the photo resist is removed by etching technique of using chemical solvents.

15. The fabrication method of claim 12, wherein the insulating material partly covers the terminal.

16. The fabrication method of claim 12, wherein the insulating material entirely covers the terminal.

17. The fabrication method of claim 12, wherein the non-solderable material is dimensioned in thickness to completely cover the conductive traces and the insulating material formed on the core layer.

18. The fabrication method of claim 12, wherein the non-solderable material has coefficient of thermal expansion similar to that of the core layer.

19. The fabrication method of claim 12, wherein the non-solderable material has coefficient of thermal expansion same as that of the core layer.

20. The fabrication method of claim 12, wherein semi-cured non-solderable material is spread over the support member; in the heating and pressurizing step, predetermined temperature and pressure are applied to the semi-cured non-solderable material, so as to cure and firmly attach the non-solderable material to the core layer.

21. The fabrication method of claim 12, wherein the non-solderable material is partly removed by using a grinder.

22. The fabrication method of claim 12, wherein the non-solderable material is partly removed by laser-etching technique.

* * * * *